US005527443A

United States Patent [19]

Chan

[11] Patent Number: 5,527,443

[45] Date of Patent: Jun. 18, 1996

[54] WORK HOLDER FOR MULTIPLE ELECTRICAL COMPONENTS

[75] Inventor: Ning-Huat Chan, Myrtle Beach, S.C.

[73] Assignee: AVX Corporation

[21] Appl. No.: 102,142

[22] Filed: Aug. 4, 1993

Related U.S. Application Data

[62] Division of Ser. No. 890,654, May 28, 1992, abandoned.

[51] Int. Cl.[6] .................... C23C 14/34

[52] U.S. Cl. .................... 204/298.15; 118/503; 269/111; 269/121; 269/287

[58] Field of Search .................... 269/287, 111, 269/113, 121; 118/500, 503, 728; 204/298.15

[56] References Cited

U.S. PATENT DOCUMENTS

| | | | |
|---|---|---|---|
| 3,223,406 | 12/1965 | Traeger | 269/287 |
| 3,627,662 | 12/1971 | Feuersanger . | |
| 3,787,312 | 1/1974 | Wagner et al. . | |
| 3,856,654 | 12/1974 | George . | |
| 3,900,432 | 8/1975 | Marcus et al. . | |
| 4,094,761 | 6/1978 | Wilson . | |
| 4,290,041 | 9/1981 | Utsumi et al. . | |
| 4,377,541 | 3/1983 | Bobik | 264/56 |
| 4,383,237 | 5/1983 | Eda et al. | 338/21 |
| 4,453,199 | 6/1984 | Ritchie et al. . | |
| 4,480,261 | 10/1984 | Hattori et al. . | |
| 4,561,954 | 12/1985 | Scrantom et al. . | |
| 4,640,860 | 2/1987 | Ritchie . | |
| 4,658,328 | 4/1987 | Sakabe | 361/309 |
| 4,741,077 | 5/1988 | Langlois | 29/25.42 |
| 4,819,128 | 4/1989 | Florian et al. . | |
| 4,869,202 | 9/1989 | Baker | 118/503 X |
| 4,900,586 | 2/1990 | Kanamori et al. | 118/503 X |
| 4,917,642 | 4/1990 | Nakahashi et al. . | |
| 4,920,915 | 5/1990 | Senda et al. | 118/503 |
| 4,953,283 | 9/1990 | Kawabata et al. | 118/503 X |
| 5,039,570 | 8/1991 | Sturm | 118/728 X |
| 5,056,702 | 10/1991 | Nakahashi et al. . | |
| 5,162,973 | 11/1992 | Miyashita et al. | 361/308 |
| 5,166,759 | 11/1992 | Ueno et al. | 257/624 |
| 5,241,094 | 10/1993 | Amano et al. | 361/308.2 |
| 5,369,390 | 11/1994 | Lin et al. | 338/21 |

FOREIGN PATENT DOCUMENTS

| | | |
|---|---|---|
| 0333149 | 3/1989 | European Pat. Off. . |
| 0363673 | 9/1989 | European Pat. Off. . |
| 2555361 | 5/1985 | France . |
| 2106714 | 4/1983 | United Kingdom . |

OTHER PUBLICATIONS

Abstract of "Electrode production on metal oxide varistors–by sputtering thin metal layer on varistor, then depositing thicker conductive metal layer", Derwent Publications Ltd., London, GB; AN 79–48373, Anonymous.

Abstract of "Electrode applying device for voltage non–linear resistor", Patent Abstracts of Japan, vol. 15, No. 348 (E–1107) Sep. 4, 1991 & JP3133102 (erroneously reported by the EPO as JP–A–03133302), (Meidensha corp.) 6 Jun. 1991.

*Primary Examiner*—Nam Nguyen
*Attorney, Agent, or Firm*—Loeb & Loeb

[57] ABSTRACT

The invention provides a method of sputtering terminations on electrical components. More particularly, the invention provides for multilayer ceramic varistors with sputtered terminations and methods of applying sputtered terminations to a plurality of varistors in a single operation.

8 Claims, 5 Drawing Sheets

WORK HOLDER FOR MULTIPLE ELECTRICAL COMPONENTS

This is a division of application Ser. No. 07/890,654, filed on May 28, 1992, abandoned.

BACKGROUND OF THE INVENTION

1. Field of the Invention

This invention relates generally to varistors and a method of sputtering terminations on varistors and like electrical components, and more particularly to multilayer ceramic varistors with sputtered terminations and methods of applying sputtered terminations to a plurality of varistors and like components in a single operation.

2. The Related Art

"Varistors" or voltage-dependent nonlinear resistors have been used as, among other things, surge absorbing elements, arresters and voltage stabilizer elements. Varistors typically employ single layer disk-shape ceramic bodies having voltage-dependent nonlinearity. Multilayer varistors became available in the market in 1988. The preparation and typical composition of this type of varistor is described in detail in U.S. Pat. No. 4,290,041 to Utsumi et al. which is incorporated herein by reference. The varistor may comprise a semiconducting block-shaped body made up of conducting grains separated by voltage sensitive grain boundaries. After formation of the varistor's ceramic body it is necessary to "terminate" the varistor, that is, to apply conductive coatings to the exposed electrode portions of the varistor. This permits the varistor to be readily connected to a printed circuit board or the like.

In a typical method of manufacturing varistors, termination is obtained by applying paste to the portions of the ceramic body having exposed electrodes. The paste may comprise a low melt glass frit and a conductive material such as silver or a silver alloy. After application of the paste, the varistor is heated to drive off solvents and/or binders and to fuse the glass including the silver to the ceramic body. The terminated varistors may have electrical leads soldered to them or be used as surface mount devices.

The described method has drawbacks. First, the terminating compound can be very costly if palladium, platinum, and/or other noble metals are added to improve leach resistance. The cost of the added materials can be ten times or more than that of silver alone. Improving leach resistance is necessary as nickel-plated terminations have become an industrial standard for surface-mount components. Second, even when palladium and other noble metals are added to the termination compound, the resulting leach resistance will not be as good as that of the terminations including a nickel barrier. To reduce cost and improve leach resistance, attempts have been made to provide varistors with a nickel barrier by a plating operation. For example, a plurality of varistors already terminated and fired with silver terminations may be placed in a plating basket in a known technique for plating ceramic capacitors. The basket is then immersed in a plating solution. After sufficient metal has been deposited, the basket is removed from the plating solution and the varistors are cleaned.

This plating operation has a number of drawbacks. One difficulty resides in the fact that the varistor is a semiconductor made up of conducting grains separated by voltage sensitive grain boundaries. This sensitivity to voltage change subjects the varistor to "creepage" during the plating process. Creepage is the phenomena where plating covers not only the end portions of the body (as it is supposed to), but begins to plate or "creep" from the end portions across the entire body from end to end. Of course, when the creepage reaches from end to end shorting occurs and the varistor is useless. This problem can be eliminated by applying an insulating compound such as a plastic binder over the areas where plating is not desired. However, this requires an added step to the process and adds to the manufacturing costs. Furthermore, the plating solution is generally acidic and will gradually etch the ceramic body if contact is made during plating.

It is believed that applicant is the first to successfully apply terminations with nickel barrier to varistors by a vacuum deposition method known in the industry as sputtering. Although sputtering capacitor terminations had been described in U.S. Pat. No. 4,561,954 to Scrantom et al., to the inventor's knowledge, no one has overcome the relatively highly conductive properties of the ceramic material used in varistors and sputtered terminations on varistors. Yet sputtering avoids the problems and cost inherent in either a paste or a plating operation.

Sputtering is advantageous in that it is possible to deposit extremely thin layers of metallic material with the assurance that all portions subjected to the deposition procedure will be intimately engaged by the deposited metal. Thus, only the entire end portion of the varistor will be contacted by the termination material. Thus, sputtering achieves favorable results over the plating of varistors with less problems and at a much lower cost.

However, a difficulty inherent in sputtering the termination materials still resides in that the deposited increments of metal will be received by all exposed portions of the varistor. Thus, unless the side faces of the varistor, that is, the faces between the ends to which terminations are to be applied are completely shielded from the sputtering operation, there is substantial likelihood of forming a film of sputtered material extending between the ends of the varistor, thereby short-circuiting the varistor.

In order to render sputtering commercially feasible as a means of terminating varistors, it is important that hundreds or even thousands of varistors be simultaneously treated. While conceptually sputtering could be simultaneously applied to a plurality of varistors imbedded in a plastic block or the like, the difficulties in aligning the varistors, casting the block, removing the surface portions of the block to expose the terminal ends of the varistors and dissolving the block after sputter applications, renders the method commercially impractical.

The applicant has used several techniques for sputtering terminations on varistors. One technique for effecting sputtered termination of varistors is the "close-pack method." In this technique, sputter termination is applied by fitting a plurality of varistors into a specially formed metallic jig or die which so closely embraces the sides of the varistors as to preclude the formation of a film of sputtered material on the side-faces of the varistors during metal deposition. In effect, the surrounding ceramic bodies adjacent to a particular body provide the "mask" for the side faces of that body. Thus, this method requires that the fabrication of the bodies and the loading of the die be of precise dimensions capable of handling large quantities of varistors in a single run.

Another technique is to sputter the terminations on the ceramic bodies while shielding the portions of the varistors which are to remain free of sputtered material by implanting the varistors in an elastomeric block or slab having apertures sized to intimately engage side portions of the varistors while exposing their ends. This technique is described in detail as being applicable to capacitors in U.S. Pat. No. 4,561,954 to Scrantom et al. ("Scrantom") which is incorporated herein by reference.

When the thickness of the mask is slightly less than the length of the mask, Scrantom permits the manufacture of "lands," terminated end portions which cover not only the ends of the capacitors but extend slightly along the side margins of the capacitors.

The technique of Scrantom is useful for applying terminations to the ends of varistors, but limits the number of varistors that can be terminated at a time since the elastomeric mask occupies a significant portion of the area where additional varistors could be located in the close-pack method.

Additionally, while such elastomeric material form an adequate shield, the material tends to "out-gas" in the course of the sputtering operation which is necessarily carried out under vacuum conditions. The result of such "out-gasing" is the formation at the interface between the deposited sputtered material and the varistors, of foreign increments or inclusions. The increments or inclusions result in the sputtered material making poor electrical contact with the electrodes and having poor adhesion with the ceramic. However, prior application to the mask of a sputtering layer or layers can avoid the out-gasing problem while leaving the mask sufficiently deformable to permit the varistors to bodily shifted from a load plate into complemental positioned apertures formed in the plate.

There is thus a need to develop a commercially practical method which combines the advantage of the close-pack method for high-density loading and of the elastomeric block method for the ability to provide "lands." It would be desirable if the technique also could be used not only to apply terminations to varistors, but terminations to other electrical components such as capacitors and resistors. Additionally, it would desirable if the technique permitted the manufacture of "lands" like the elastomeric method described in Scrantom without "robbing" useful space in the die where additional varistors could be placed. This simply cannot be achieved in the close-pack method.

SUMMARY OF THE INVENTION

The present invention provides for varistors having sputtered terminations and a method of terminating varistors as well as other types of electrical components by an improved sputtering process. In one aspect the invention provides for masking the electrical components during sputtering with high density packing. Additionally, if desired, the invention permits for the manufacture of "lands" on the varistors or components without sacrificing much space where additional varistors could be placed as required by a conventional masking method.

In accordance with one exemplary form of the invention, there is provided a method for readily masking varistors to enable the application of sputter terminations. The improved method combines the advantages of the close spacing of parts of the close-pack method as well as the advantages available under a conventional masking method.

After completion of the sputtering operation the electrical components are removed from the process, following which such additional conventional operations may be effected on the components as desired.

It is accordingly an object of the invention to provide a new and useful method of applying sputter terminations to varistors or to like electrical components.

BRIEF DESCRIPTION OF THE DRAWING

In order to attain this and such other objects as may appear herein or be pointed out hereinafter, reference is made to the accompanying drawings in which.

DETAILED DESCRIPTION OF THE PREFERRED EMBODIMENTS

Figure 4:
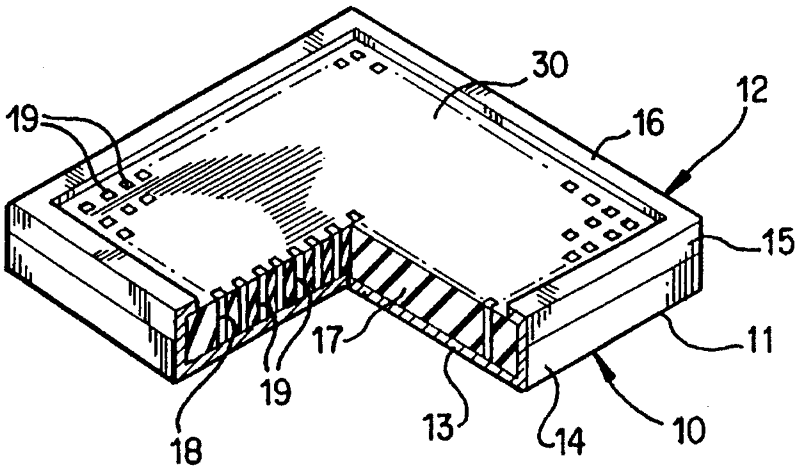
FIG. 4 is a perspective view on a smaller scale of the filled jig or frame assembly ready to be introduced into the sputtering apparatus, with portions of the apparatus cutaway to show interior detail.

FIG. 4 is a perspective view of a fixture or assembly for introduction into a sputtering apparatus. The fixture includes a bottom frame portion 11 and an upper frame component 12. The bottom frame 11 comprises a base portion 13 and a surrounding side wall portion 14. The upper frame component 12 includes a side wall portion 15 and an inwardly directed lip portion 16. The frame encompasses a mask 17 formed of an elastomeric material.

A preferred elastomer is sold under the registered trademark SILASTIC and manufactured by the Dow Corning Corporation of Midland, Mich. SILASTIC comprises a silicone rubber. A preferred grade for the application is J RTV Silicone Rubber. Alternative silicone rubber compositions may also be used.

Figure 1:
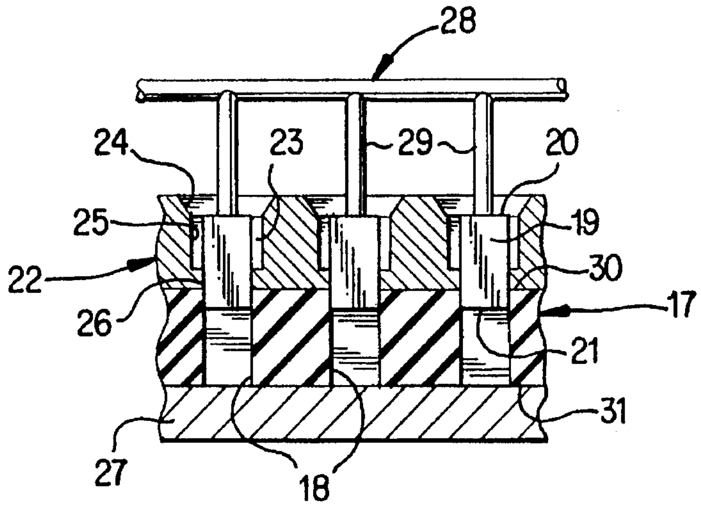
FIG. 1 is a diagrammatic fragmentary sectional view of portions of the loading mechanism and mask during initial stages of loading of varistors into the mask.
Figure 2:
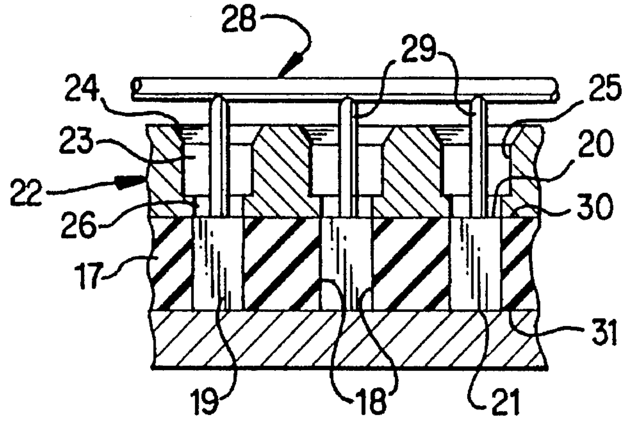
FIG. 2 is a section similar to FIG. 1 showing the position of the loading assembly components after the varistors have been inserted into position within the mask member.
Figure 3:
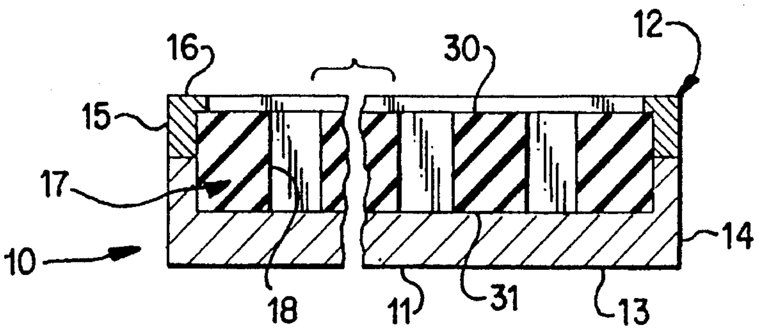
FIG. 3 is a fragmentary sectional view of the mask inserted in a jig or frame adapted to be introduced into the sputtering apparatus.

The mask 17 as shown in FIGS. 1, 2 and 3, includes a plurality of apertures 18 of a size which intimately embrace varistors 19 which are to be terminated at their opposite ends 20 and 21.

As will be understood by those of ordinary skill in the art relating to manufacture of electrical components, varistors

19 are manufactured in a manner which causes the electrodes to be exposed at one or the other of the end faces 20 or 21. It is the function of a termination to connect all of the electrodes. The terminations also function as an anchor point for leads or the like so the varistor can be introduced into an electrical circuit.

FIGS. 1 and 2 illustrate an apparatus for introducing the varistors into the apertures 18 in the mask 17.

It will be appreciated that for economical manufacture each mask may desirably include thousands of apertures. In order to facilitate filling the multiple apertures of the mask there is provided a load plate 22 which is provided with a plurality of apertures 23 corresponding in number and position with the apertures 18 of the mask 17. The apertures 23 of the load plate include tapered or funnel like lead portions 24 of a size significantly larger than the cross-section of the varistors 19, the lead portion 24 merging with a guide portion 25 and finally a discharge portion 26. The dimensions of the guide portion 25 are slightly larger than the cross-sectional dimensions of the varistor and function to guide the varistors into the discharge portion 26, which latter portion is sized to closely correspond with the cross-sectional dimensions of the varistors.

In practice, the load plate 22 may be filled by placing the plate beneath a bulk supply of varistors, the plate being vibrated or reciprocated in a horizontal plane for a period of time during which period varistors are caused by the vibratory movement to enter into the various apertures 23. After a period of oscillation or vibration beneath the bulk supply, the plate 22 is removed and continuously caused to vibrate. After a period of time the varistors will have reached positions wherein one or the other of the end portions 20 or 21 will have progressed at least into the guide portion 25 of the apertures 23 of the load plate.

The filled load plate 22 is thereafter superposed over mask 17 in a fixture. The fixture is provided with a back-up plate 27 disposed beneath mask 17. The fixture is disposed within a loading jig assembly which includes a pusher grid 28 having a plurality of depending pusher rods 29 spaced to register with the apertures 23 of the load plate. The pusher grid 28 is thereafter shifted down so as to force the varistors out of the load plate 22 and into the apertures 18 of the mask 17.

In FIG. 1 the pusher grid 28 is disclosed as having descended part way down such that the lower terminal ends 21 of the varistors have been caused to enter part way into the elastomeric mask 17.

In FIG. 2 the grid 28 is shifted to its lowermost position with the result that the varistors 19 have been advanced into the mask 17 such that the upper and lower ends 20, 21 of the varistors are in substantial co-planar alignment with the upper and lower surfaces 30, 31 of the mask 17. Due to the elasticity and deformability of the mask 17 the varistors will be retained by friction of the mask in the position noted.

Additionally, the flexibility of the mask enables the varistors to be forced into this position despite a slightly imperfect alignment of the lower ends 21 of the varistors with the uppermost ends of the apertures 18. Where such slight misalignment occurs the downward pressure on the varistors is sufficient to deform the mask whereby the downwardly moving varistor is forced into the slightly misaligned aperture in the mask.

The filled mask is mounted within the fixture as best illustrated in FIG. 4.

In this mounted position, the side margins of the mask abut against the inner surfaces of the sidewall 14 of base plate 11. Thereafter the upper frame member 12 is clamped over the base plate 11 such that the sidewalls 15 of the frame 12 abut the side margins of the mask 17 above side wall 14, and the lip 16 of the frame overlaps the top surface 30 of the mask adjacent an edge portion thereof.

As will be understood from the detailed description set forth below, the sputtering process necessitates subjecting the components to be sputtered to vacuum conditions. Thus, a high failure rate will be engendered by the tendency of the elastomeric materials employed to "out-gas" progressively under vacuum conditions.

As a result of the "out-gasing," a predictable adhesion of the sputtered metal to the exposed electrode layers will not be obtained. Instead a multiplicity of glassy inclusions will result with concomitant poor adhesion of metal to electrodes and unpredictability as to the number of electrodes to which good contact was obtained.

Figure 1A:
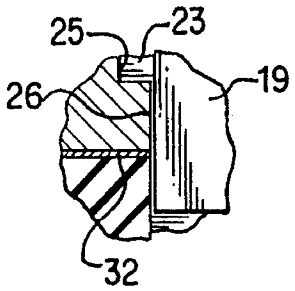
FIG. 1*a* is a magnified fragmentary view of a portion of the apparatus illustrated in FIG. 1.

The "out-gasing" problem can be solved by subjecting the mask 17, prior to loading, to a sputtering step to deposit a thin metallic film over the surfaces 30, 31 of the mask. The thickness of the film may be no more than a tenth of a micron or less, and functions to preclude out-gasing. Subsequent sputtering steps can be carried out whereby a pure metallic layer will cover both exposed ends of the varistors and the predeposited film. This is diagrammatically illustrated at 32 in FIG. 1*a*.

It will be understood that both the upper and lower surfaces 30 and 31 of the mask are subjected to the pre-sputtering step. After a sputter coating is effected over one of the surfaces 30 the mask is removed from the fixture and inverted so that a subsequent sputtering operation covers the surface 31 as well as the varistor ends 21 which are exposed when the mask is inverted.

After both surfaces of the mask and varistors have been sputtered, the varistors are removed from the apertures by a pusher grid assembly similar to grid 28. The grid assembly includes pusher rods which enter into the aligned apertures of the mask and drive the finished varistors from the apertures 18.

After removal of the varistors the mask may be refilled and reused without a prior pre-sputtering step, since the mask will include a metal coating comprised of the initial pre-sputtered coating as well as the over sputtering deposited on the surfaces of the mask by the sputtering procedure employed to terminate the varistors. The mask may be reused until the coating or build up on the surface of the mask renders the mask unduly stiff or resistant to deformation, following which it is necessary to chemically remove the metallic build-up from the surfaces of the mask, subject the mask to a further pre-sputtering step, and thereafter repeat the cycle.

Figure 5:
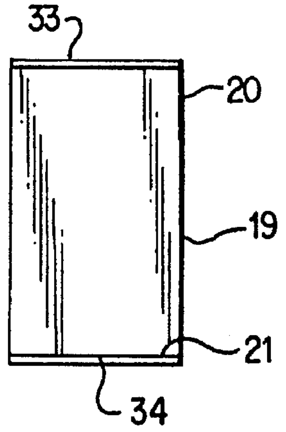
FIG. 5 is a side elevation view of a sputter terminated varistor.

There is shown in FIG. 5 a finished varistor 19 having upper and lower surfaces 20 and 21 to which have been applied metallic layers 33, 34, respectively. Lead members may be soldered to the terminations 33, 34 by any of a number of conventional procedures.

Figure 6:
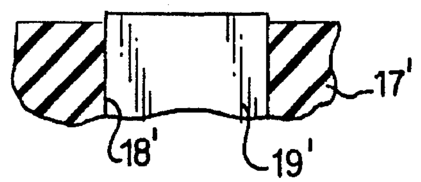
FIG. 6 is a fragmentary view of a varistor mounted in a mask in accordance with an embodiment of the invention.
Figure 7:
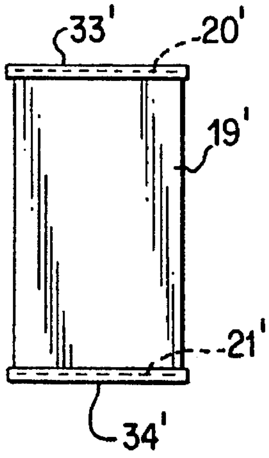
FIG. 7 is a terminated varistor formed in accordance with the embodiment shown in FIG. 6.

In FIG. 7, a varistor is shown which is similar to that shown in FIG. 5. The varistor of FIG. 7 differs from that of FIG. 5 in that the termination portions 33', 34' cover not only the ends' 20', 21' of the varistor 19,' but also extend slightly along the side margins of the varistor. These structural features are referred to as "lands." The embodiment of FIG. 7 is fabricated by loading the varistors 19' into a mask 17' so that the upper and lower surfaces (only the upper surface being shown in FIG. 6) project slightly beyond the upper and lower margins of the mask 17'. This condition is achieved by using a mask of slightly lesser thickness than the length of the varistors and by introducing a slightly compressible layer between the undersurface of the mask 17' and load plate 27. Under such circumstances, the pusher rods 29 will force the lower ends of varistors 19' through the body of the mask 17' so that they indent slightly into the compressible layer. Both ends of the varistors will then project slightly above and below the upper and lower surfaces of the mask 17'. Thus, the masking method permits the manufacture of lands a feature which is not obtainable with the next method.

Another method for effecting sputtered termination of varistors is the close-pack method. In this technique, sputter termination is applied by fitting a plurality of varistors into a specially formed metallic jig or die which so closely embraces the sides of the varistors as to preclude the formation of a film of sputtered material on the side-faces of the varistors during metal deposition. In effect, the surrounding ceramic bodies adjacent to a particular body provide the "mask" for the side faces of that body. This method requires that the fabrication of the bodies and the loading of the die be of precise dimensions capable of handling large quantities of varistors in a single run. Nevertheless, if this is not a problem due to the standardization of the size of those parts and high volumes, the method maximizes efficiency in sputtering the parts by using all of the available space within the jig or die because it does not include a mask between parts.

One aspect of the invention provides a preferred method combining the high manufacturing efficiency of the close-pack method. Additionally, if desired, the preferred method can provide for the formation of lands like the elastomeric masking method discussed earlier yet avoid the loss of useful area in the die for processing additional varistors. As will be seen, the method is not limited to applying terminations to varistors, but can be also used to apply terminations to other electrical components. For the sake of brevity, however, the method will be discussed in the context of sputtering terminations on varistors.

Figure 10:
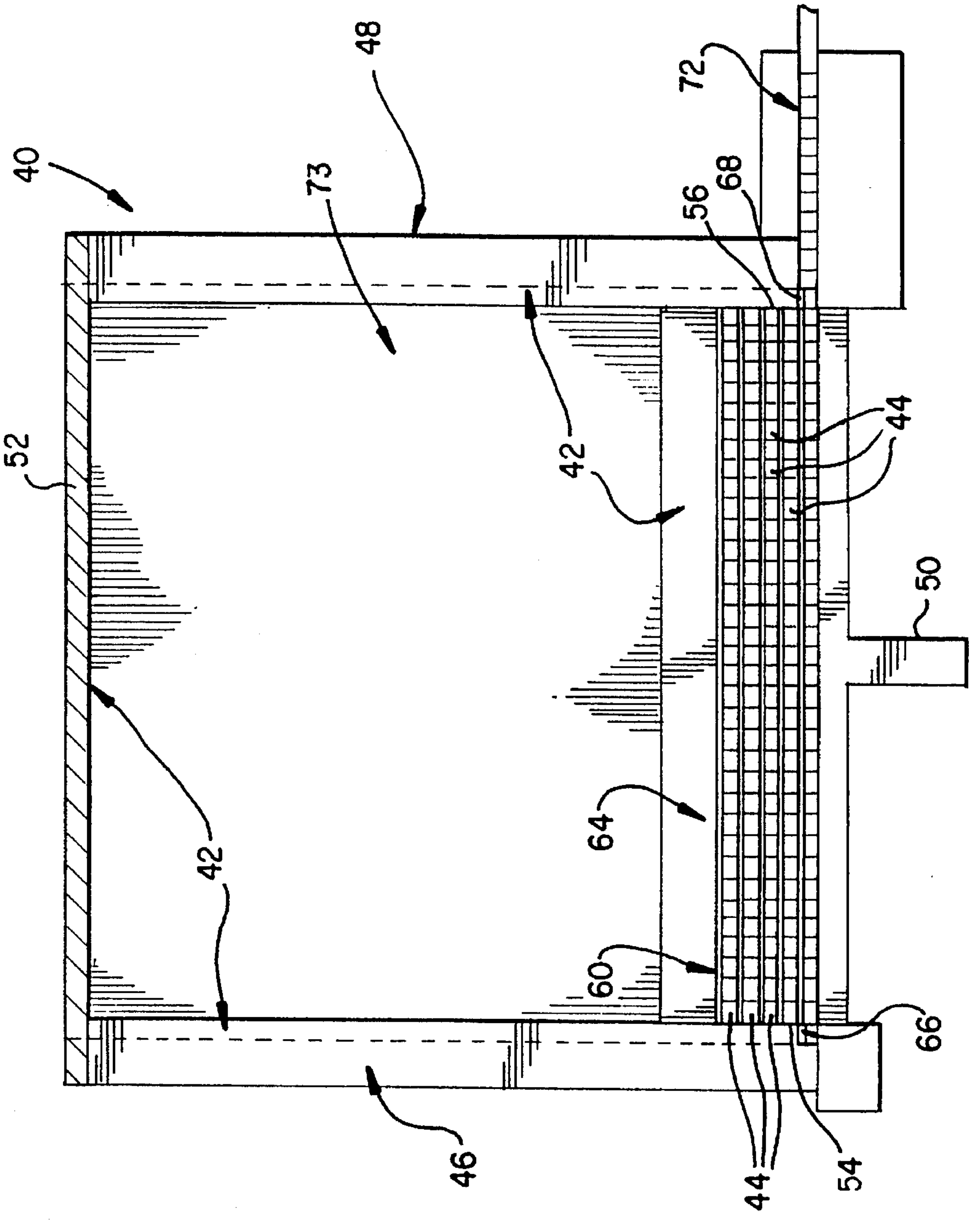
FIG. 10 is a plan view of a loading device which includes a frame for holding the varistors in place during the sputtering process.

As shown in FIG. 10, in the preferred method, the invention provides a varistor loading device 40 including a movable frame 42. The frame 42, a bottom plate 73 and a closing bar 75 (FIG. 11) attached after loading is completed serve to hold the varistors 44 during the sputtering process. As with the previous methods, the frame 42 is square or rectangular-shaped. However, in contrast to the previous methods, the frame 42 changes dimensions during the loading sequence.

Figure 11:
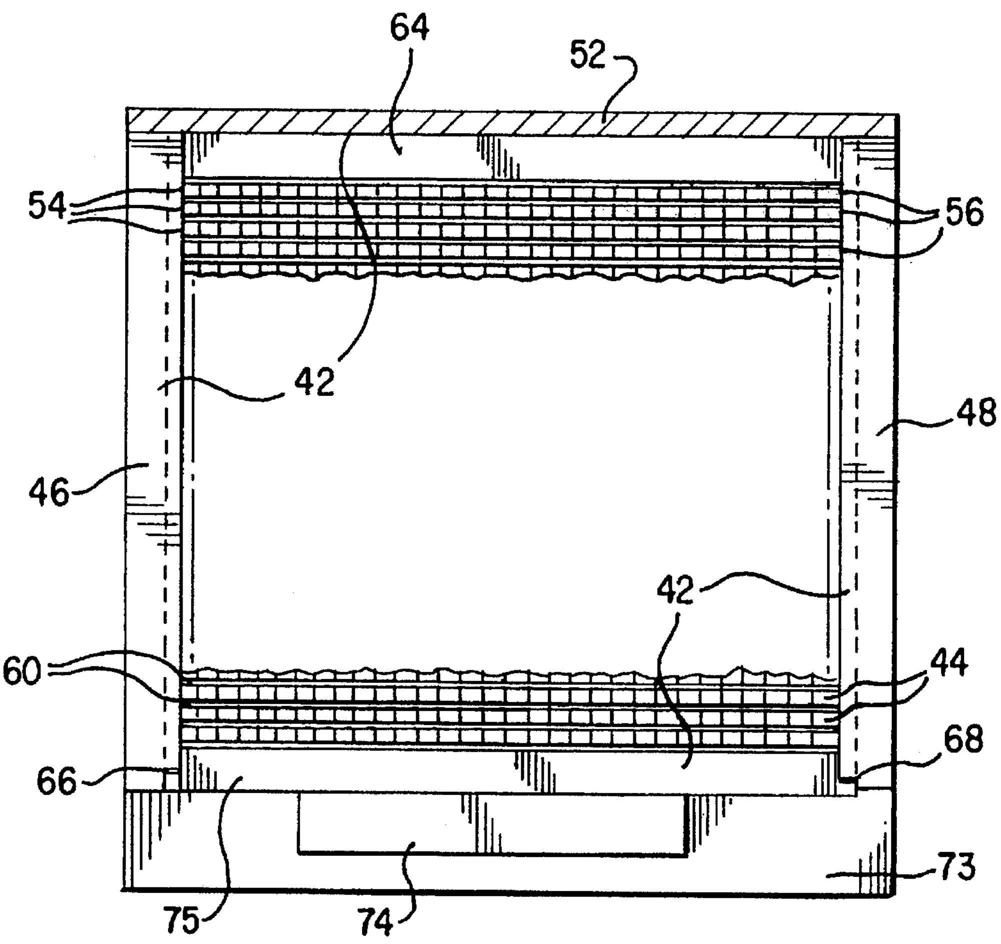
FIG. 11 is a plan view of a fully loaded plate (varistors in middle portion of plate not shown) which shows a frame, a plate and a retainer.

FIG. 11 illustrates that the frame 42 may be made up of two holding bars 46, 48, a movable bar 64 and a closing bar 75. The holding bars 46, 48 are parallel to one another. The sliding bar 64 and closing bar 75 are also parallel to one another. Each holding bar 46, 48 is connected at one of their ends to the stop bar 52 where the movable bar 64 rests When the plate is fully loaded forming a three-sided "fixed" portion of the frame 42. The closing bar 75 is the "fourth side" of the frame 42. The two holding bars 46, 48 of the frame 42 are in a fixed relationship during the loading and sputtering process, whereas the movable bar 64 moves incrementally with each push of the push bar 50 during the loading sequence.

As shown in FIG. 10, the rows of varistors 44 are loaded into the frame 42 in predetermined lengths. The rows are oriented during the loading process so that they are parallel to the stop bar 52 and the push bar 50 and are confined at their ends 54, 56 by the holding bars 46, 48. The stop bar 52 will function to confine the total number of rows which can be loaded into the frame 42 as explained in the following discussion.

Figure 8:
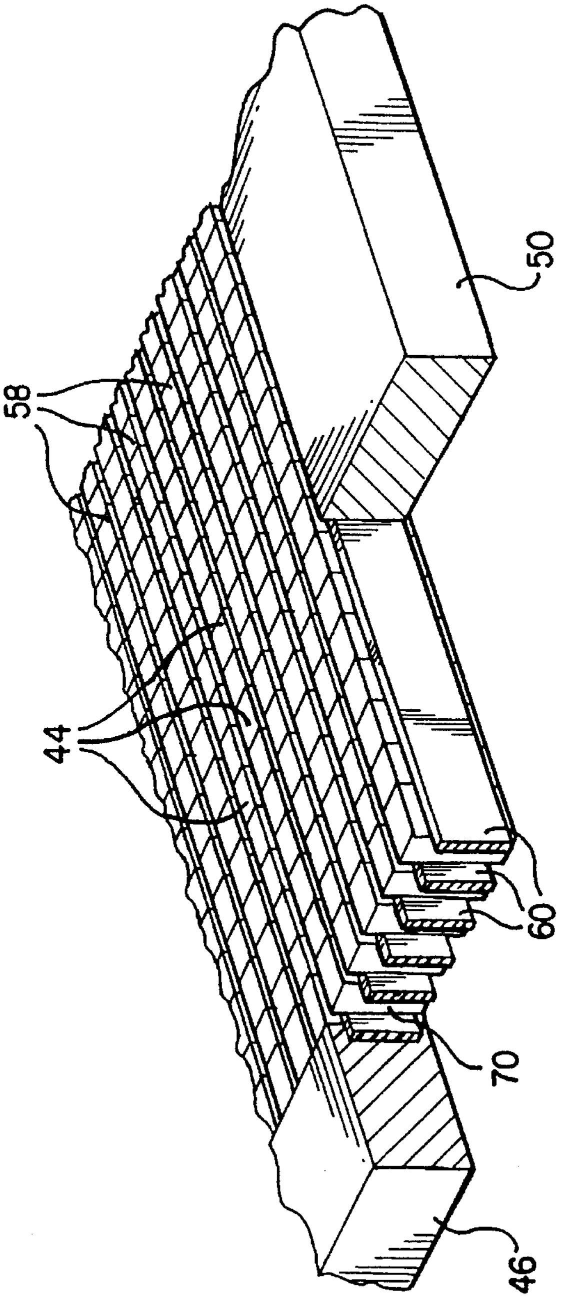
FIG. 8 is a partial perspective view of a preferred arrangement of rows of varistors alternating with spacing strips in a frame. The spacing strips mask the row faces of the varistors. The adjacent varistors mask the column faces of the adjacent varistors within that row.

As shown in FIG. 8, the varistors 44 are packed transverse to the frame 42 so that only their ends 58 where the termination is to be applied is exposed. The varistors 44 are block-shaped, and serve as "masks" for their adjacent varistors 44 along the "column-face" A spacing strip 60 masks the "row face" of the varistors 44. In the illustrated embodiment of FIG. 8, the method provides that each row of varistors 44 is separated from the adjacent rows by spacing strips 60.

Figure 9:
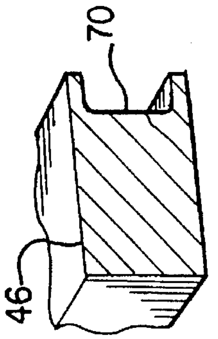
FIG. 9 is a fragmentary close-up sectional view of a holding bar.

In operation, the varistors 44 are loaded in the frame 42 for sputtering in the following manner (FIG. 10). First, a spacing loader 62 disposed above the frame 42 inserts a rectangular-shaped spacing strip 60 in front of the "open portion" of the frame 42 so that the strip 60 rests against a sliding bar 64 located in the frame 42 and parallel to the push bar 50. Each end of the strip 60 is initially held in a feed-in slot 66, 68 in each holding bar 46, 48. Subsequently, the strip 60 is held in a groove 70 in the holding bars 46, 48 (FIG. 9). Thus, initially, the strip 60 rests against the sliding bar 64.

A varistor feeder (not shown) located over the frame 42 feeds a row of varistors 44 into the frame 42 next to the strip 60. The row alignment device 72 packs the varistor row tightly together (from right to left) so that there are no "gaps" in the row. Next, the push bar 50 pushes the row of varistors 44, the strip 60, the sliding bar 64 as a "single unit" an incremental distance (i.e., one row width) into the frame 42. Thus, during the loading process, the row of varistors 44 are held together as a unit at their ends by the parallel holding bars 46, 48, and by the push bar 50 and the sliding bar 64. After a row of varistors 44 is pushed into the frame 42 the push bar 50 moves back out of the frame and the spacing loader 62 inserts another strip 60 next to the row of varistors 44 just inserted.

The process is then repeated until the entire frame 42 is filled with varistors 44, that is, when the sliding bar 64 contacts the stop bar 52 and can proceed no further. Once the frame 42 is filled, the closing bar 75 and the retainer 74 are attached (FIG. 11). The resulting assembly is then transported to a suitable work space for sputtering of the terminations of the varistors 44.

In one embodiment, the spacing strip 60 is rectangular-shaped and has a width which equals the end to end dimension or length of the varistors 44. Favorable results have been achieved when the spacing strip 60 is made of rigid plastic. However, any other materials of similar or greater rigidity such as metal may also be suitable. In another embodiment, the spacing strips can be omitted so that a true close-pack arrangement is achieved.

Figure 12:
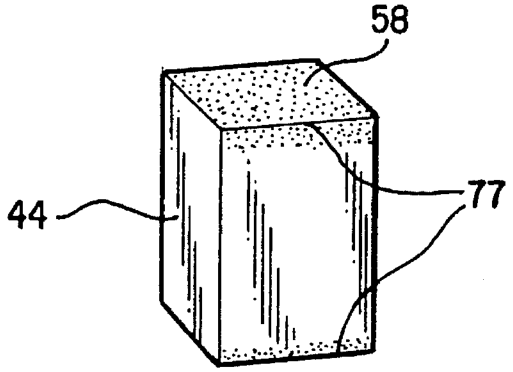
FIG. 12 is a perspective view of a sputtered varistor with a sputtered end and two-sided lands.

In yet another embodiment, the spacing strip 60 has a width slightly less than the length of the varistor 44. This latter embodiment permits the formation of terminations extending beyond the end faces of the varistors creating the so-called "lands" (FIG. 12). Thus, the end portions may optionally project slightly beyond the spacing material or may be flush with the spacing material.

One preferred sputtering procedure is set forth below. Prior to loading, the varistors are cleaned utilizing a conventional freon type decreasing compound and are thermally etched for approximately an hour at 810° C. The loaded and precoated fixtures described are sputter coated by passing the same beneath the target of a sputtering device. Optionally, but preferably, an in-line sputtering system such as a system identified as the SERIES 900 SPUTTERING DEVICE as manufactured by MATERIALS RESEARCH CORPORATION of Orangeberg, N.Y., may be employed.

An in-line sputtering system is preferred in that it permits the fixtures to be progressively advanced beneath target areas of different compositions whereby a layer of a first sputter deposited material may be formed directly over the exposed surface and thereafter a second and if desired a third layer applied. Desirably, a thin chromium layer (0.01 to 0.1 μm) may be applied for adhesion. Thereafter, a thin layer nickel or nickel vanadium layer (0.1 to 2 μm) and a final silver or tin layer (1 to 15 μm). The nickel layer provides a barrier against leaching of the silver layer when electrical connections are soldered to the terminations of the varistors.

To complete the sputtering procedure, the assembly is placed in a vacuum load lock which is pumped to a pressure of less than 50×10–5 torr and thereafter introduced into the main sputtering chamber.

Sputtering may be effected at a power level of 4.2 kilowatts and scan speed of approximately millimeters per second across the target area. Sputtering is performed preferably in an argon gas environment at a pressure of 10×10–5 torr. Where a chromium substrate is used for a high adhesion layer, thicknesses in the range of 0.04 to 0.08 micrometers are preferred. A nickel coating of from 0.4 to 1.0 micrometers has been found to be optimum. Where a silver or palladium overcoating is to be employed a coating thickness of 1 micron has been found sufficient.

After the sputtering of the first end of the varistors 44 is done, a separate plate 73 is attached to the frame 42 and the retainer 74 by screws and the whole assembly is flipped over. The top plate is then removed and the opposite ends may be sputtered.

When the mask method is used, the precoating of the surfaces of mask 17 may be applied by using a chromium target material. In this event, the coating thickness is non-critical, but is initially in the range of about 0.15 micrometers. As previously noted, the initial chromium presputter coating will be oversputtered in the course of treating varistors and thus will increase significantly in thickness after being used for a series of varistor sputtering cycles.

From the foregoing, it will be apparent that there is shown and described a method for the effective termination of varistors of the multilayer type whereby a plurality of varistors may be simultaneously and effectively treated. By way of example and without limitation a mask of 4 inches by 4 inches may carry over thirteen hundred "1206 style" varistors for simultaneous treatment in an elastomeric frame, 5700 varistors in a plastic lined frame, and 7400 varistors if the plastic spacers are not used.

From the foregoing, it will be appreciated by those skilled in the art that there is shown and described a method of effectively terminating varistors by several different methods. Each method having certain advantages with the last method combining several advantages of earlier methods in one operation.

It is also apparent that the methods can be used to effectively apply sputtered terminations on not only varistors, but other types of electrical components as well. Finally, numerous variations of the described procedures may readily occur to those skilled in the art once they have been made familiar with the disclosure of the present invention.

I claim:

1. A device for holding multiple electrical components in place during a sputtering process, comprising:

a frame for the holding components in a desired position, including two parallel holding bars, a movable bar and a stop bar; and wherein the stop bar includes two opposing ends, each end of the stop bar connected to an end of each holding bar, whereby the stop bar and the holding bars define a three-sided fixed portion of the frame and the movable bar defines the fourth side adapted for movement during the loading of the electrical components, further comprising a row alignment device which is adapted to position a row of components adjacent the movable bar and pack the row together so that there are no gaps between adjacent components.

2. The device of claim 1, wherein the movable bar is adapted to move incrementally into the three-sided fixed portion of the frame after each row of components is positioned adjacent the movable bar.

3. The device of claim 1, further comprising a spacing loader adapted to load spacing strips between adjacent rows of the components.

4. The device of claim 1, further comprising a bottom plate which is adapted to provide a surface to retain and hold the components in place during transportation of the device.

5. The device of claim 1, further comprising a closing bar having two ends, the closing bar adapted for attachment at one end of each holding bar after the components have been loaded.

6. The device of claim 1, further comprising a plurality of spacing strips disposed within the frame and positioned parallel to the stop bar and movable bar.

7. The device of claim 1, further comprising:

at least one spacing strip disposed within the frame in a position parallel to the stop bar;

a groove disposed along a portion of each holding bar;

a portion of the at least one spacing strip being located within the groove of each holding bar, and the holding bars supporting the at least one spacing strip.

8. The loading device of claim 1, further comprising a push bar which is adapted to push components into the frame.

* * * * *